United States Patent
Aoki et al.

(10) Patent No.: US 8,213,182 B2
(45) Date of Patent: Jul. 3, 2012

(54) HOUSING CASE FOR HOUSING ELECTRONIC CIRCUIT BOARD, AND ELECTRONIC APPARATUS

(75) Inventors: Syuzo Aoki, Nagano (JP); Meisou Chin, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 292 days.

(21) Appl. No.: 12/616,971

(22) Filed: Nov. 12, 2009

(65) Prior Publication Data
US 2010/0265675 A1 Oct. 21, 2010

(30) Foreign Application Priority Data

Apr. 21, 2009 (JP) .................................. 2009-103301

(51) Int. Cl.
*H05K 5/00* (2006.01)
(52) U.S. Cl. ......... 361/752; 361/737; 361/748; 361/816
(58) Field of Classification Search ............... 361/752, 361/816, 737, 748
See application file for complete search history.

(56) References Cited

U.S. PATENT DOCUMENTS 5,353,201 A * 10/1994 Maeda ........................ 361/816
6,577,506 B1 * 6/2003 Wakita et al. ................ 361/737

FOREIGN PATENT DOCUMENTS

| JP | 3024721 | 3/1996 |
| JP | 2007-335672 | 12/2007 |

* cited by examiner

*Primary Examiner* — Yuriy Semenenko
*Assistant Examiner* — Andargie M Aychillhum
(74) *Attorney, Agent, or Firm* — Rankin, Hill & Clark LLP (57) ABSTRACT

A housing case housing an electronic circuit board, includes: a lower case portion which internally houses a circuit board for mounting electronic components; and an upper case portion which is externally fitted to the lower case portion to form a box-like member. Each of the lower case portion and the upper case portion includes a planar portion, and sidewall portions which stand from the peripheral edge of the planar portion. The planar portion and the sidewall portions are formed by using a plate-like member made of a metal material. Engaging projections which are outwardly projected are disposed on the sidewall portions of the lower case portion. Engaging holes which are passed through the sidewall portions of the upper case portion are disposed in the sidewall portions, in positions corresponding to the engaging projections of the lower case portion. The upper case portion is externally fitted to the lower case portion, and the engaging projections are engaged with the engaging holes, whereby the lower case portion and the upper case portion are fixed to each other.

10 Claims, 10 Drawing Sheets

HOUSING CASE FOR HOUSING ELECTRONIC CIRCUIT BOARD, AND ELECTRONIC APPARATUS

This application claims priority from Japanese Patent Application No. 2009-103301, filed on Apr. 21, 2009, the entire contents of which are hereby incorporated by reference.

FIELD OF THE INVENTION

The present invention relates to a housing case for housing an electronic circuit board, and an electronic apparatus, and more particularly to a housing case for housing an electronic circuit board, and an electronic apparatus, in which an upper case portion is externally fitted to a lower case portion that internally houses a circuit board mounting electronic components, and which has a box-like member.

DESCRIPTION OF RELATED ART

As examples of an electronic apparatus in which an upper case portion is externally fitted to a lower case portion that internally houses a circuit board mounting electronic components (hereinafter, referred to as "mounting circuit board"), to form a box-like member, there are a memory card or communication card which is to be attached to a card slot of a personal computer (hereinafter, abbreviated as "PC"), and a storage apparatus such as an Solid State Drive (SSD) which is to be incorporated in the main unit of a PC, and on which a flash memory is mounted.

A related-art memory card will be described as an example. Usually, a memory card includes two metal plates, and a plastic frame which houses a mounting circuit board, and has a structure where the metal plates are fixed to each other by welding, screwing, riveting, or the like. Also, Japanese Utility Model Registration No. 3,024,721 discloses a technique for bonding a plastic frame to one metal plate by using the injection molding.

In order to prevent unintentional erasure and/or writing of storage information from occurring, for example, such a memory card, a flash memory, or the like is requested to have a magnetic shielding structure. Japanese Unexamined Application Publication No. JP-A-2007-335672 discloses an example of the shielding structure.

Usually, a related-art apparatus such as a memory card or an SSD has a structure where lower and upper case portions for protecting a mounting circuit board, and the mounting circuit board are fixed to each other by screwing or riveting, or that where, while assembling resin parts and the like for internally fixing a mounting circuit board, lower and upper case portions for protecting the mounting circuit board are fixed to each other by welding, screwing, or riveting.

In the related-art, however, the number of used parts is increased, thereby causing a problem in that the production cost is raised. When welding, screwing, or riveting is employed as a fixing method, production steps are complicated, and the time required for production is prolonged. Therefore, there arises another problem in that the production efficiency is low.

SUMMARY OF INVENTION

Illustrative aspects of the present invention provide an electronic apparatus in which, while the number of parts necessary for fixing a mounting circuit board is reduced as far as possible, the mounting circuit board can be easily fixed together with lower and upper case portions.

According to a first aspect of the invention, a housing case for housing an electronic circuit board, includes: a lower case portion which internally houses a circuit board mounting electronic components; and an upper case portion which is externally fitted to the lower case portion to form a box-like member. Each of the lower case portion and the upper case portion includes a planar portion, and sidewall portions which stand from a peripheral edge of the planar portion, the planar portion and the sidewall portions being formed by using a plate-like member made of a metal material, engaging projections which are outwardly projected are disposed on the sidewall portions of the lower case portion, engaging holes which are passed through the sidewall portions of the upper case portion are disposed in the sidewall portions, in positions corresponding to the engaging projections of the lower case portion, the upper case portion is externally fitted to the lower case portion, and the engaging projections are engaged with the engaging holes, whereby the lower case portion and the upper case portion are fixed to each other, in the lower case portion, a part of tip end portions of the sidewall portions is inwardly bent to be formed as urging force generating portions, and another part of the tip end portions of the sidewall portions is formed so as to be lower in height from the planar portion than the urging force generating portions, and when the upper case portion is externally fitted to the lower case portion, tip end portions of the urging force generating portions or portions in vicinities of the tip end portions butt against and slide over the planar portion of the upper case portion to be further bent, thereby generating an urging force.

Other aspects and advantages of the invention will be apparent from the following description, the drawings and the claims.

DETAILED DESCRIPTION OF EXEMPLARY EMBODIMENTS

As an electronic apparatus 1 according to a first exemplary embodiment of the invention, an SSD using a NAND-type flash memory will be exemplarily described. An SSD is an electronic apparatus which is to be incorporated into the main unit of a PC or attached to a card slot of a PC to be used as a high-speed storage apparatus.

Figure 1A:
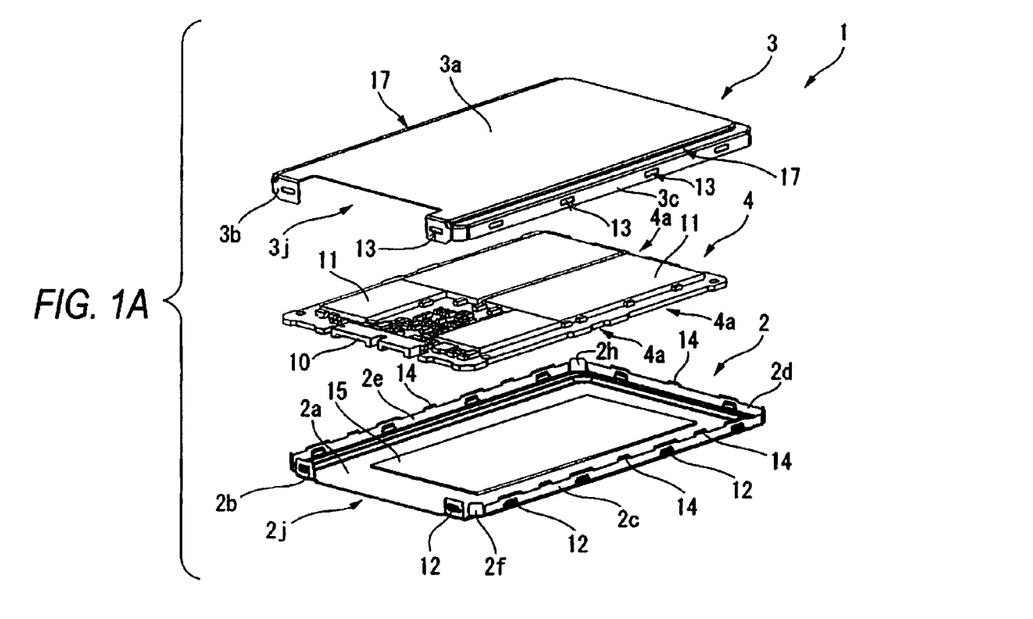
FIGS. 1A and 1B are schematic views showing an example of an electronic apparatus according to a first exemplary embodiment of the invention.
Figure 1B:
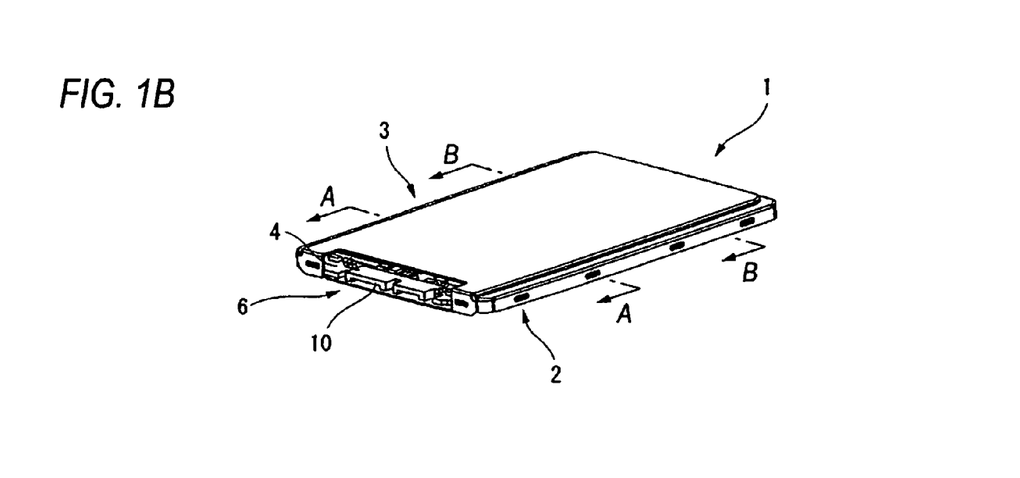
Figure 2A:
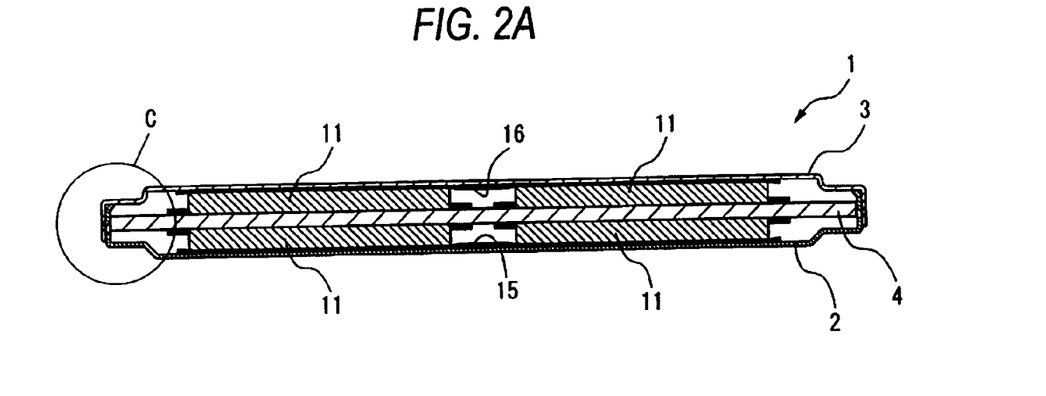
FIGS. 2A and 2B are sectional views showing an example of the electronic apparatus (in a state where lower and upper case portions and a mounting circuit board are fixed) of FIGS. 1A and 1B.

As shown in FIGS. 1A and 1B, the electronic apparatus 1 includes: a lower case portion 2 that internally houses a circuit board (mounting circuit board) 4 on which electronic components 11 are mounted; and an upper case portion 3 that is externally fitted to the lower case portion 2 to form a box-like member. FIG. 1A is a perspective view showing a state before the lower case portion 2, the upper case portion 3, and the mounting circuit board 4 are fixed to each other, and FIG. 1B is a perspective view showing a state after they are fixed to each other. FIG. 2A is a sectional view (taken along line A-A in FIG. 1B) of a state where the upper case portion 3 is externally fitted and fixed to the lower case portion 2 in which the mounting circuit board 4 is housed.

Figure 3A:
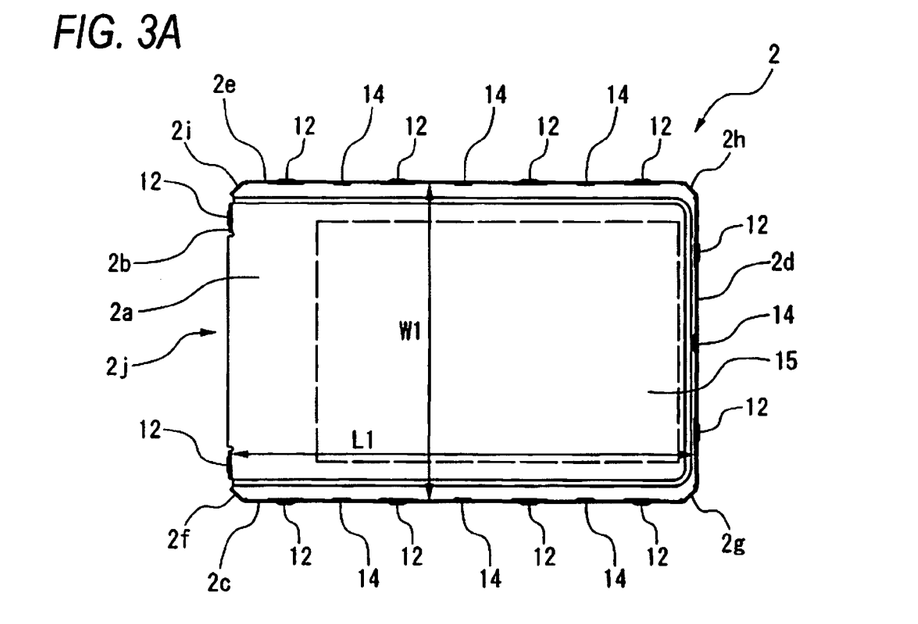
FIGS. 3A to 3C are schematic views showing an example of the lower case portion of the electronic apparatus of FIGS. 1A and 1B.
Figure 3B:
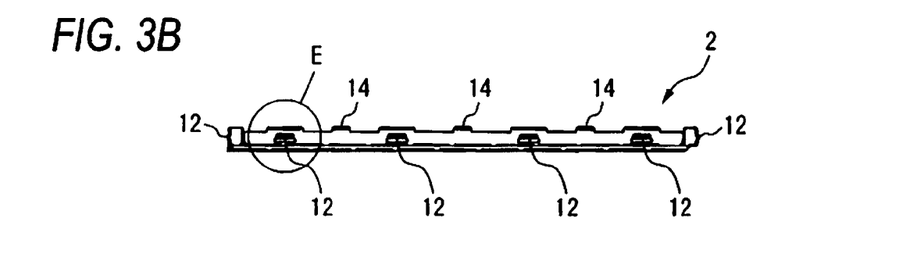
Figure 3C:
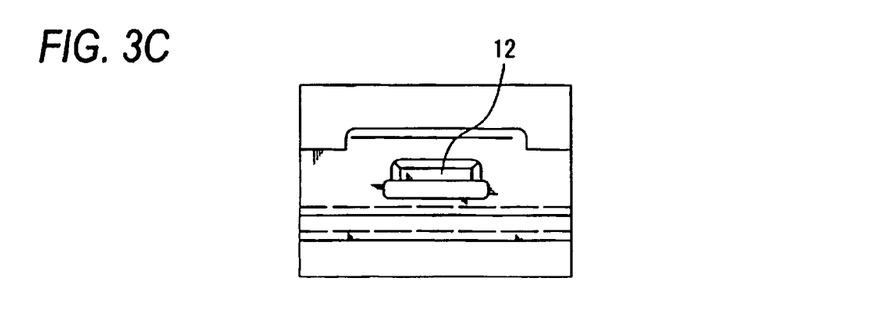

FIG. 3A is a plan view of the lower case portion 2, and FIG. 3B is a front view thereof. FIG. 3C is an enlarged view (an enlarged view of portion E of FIG. 3B) of an engaging projection 12 which will be described later.

The lower case portion 2 is formed by bending a thin plate-like member made of a metal material and having a thickness of several hundreds of μm, into a case-like shape which has a rectangular planar portion 2a, and sidewall portions 2b, 2c, 2d, 2e that stand from the four peripheral sides of the planar portion 2a, respectively, and in which one face (the upper face in FIGS. 1A and 3B) is opened.

Figure 4A:
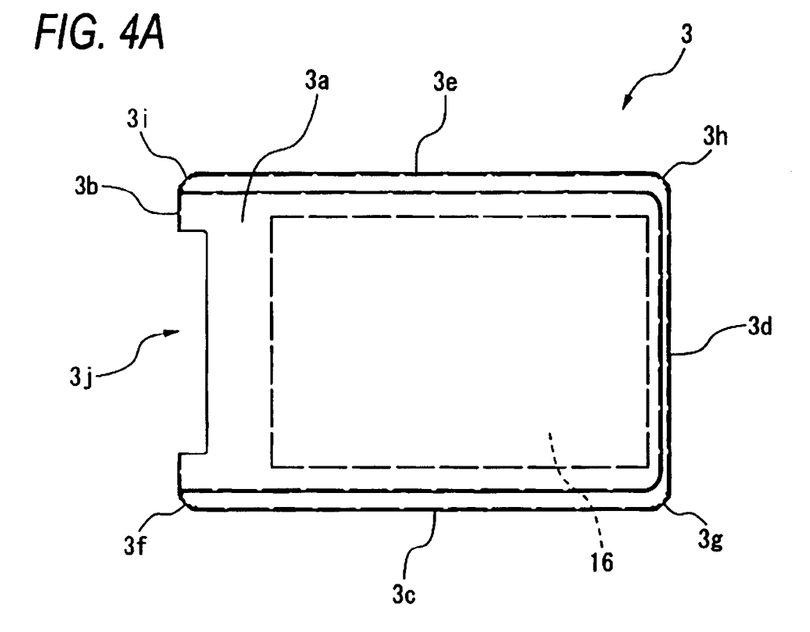
FIGS. 4A to 4C are schematic views showing an example of the upper case portion of the electronic apparatus of FIGS. 1A and 1B.
Figure 4B:
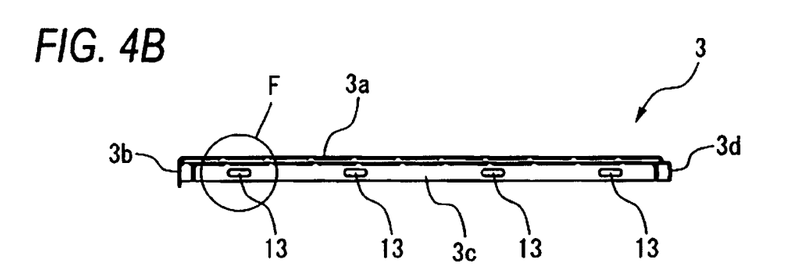
Figure 4C:
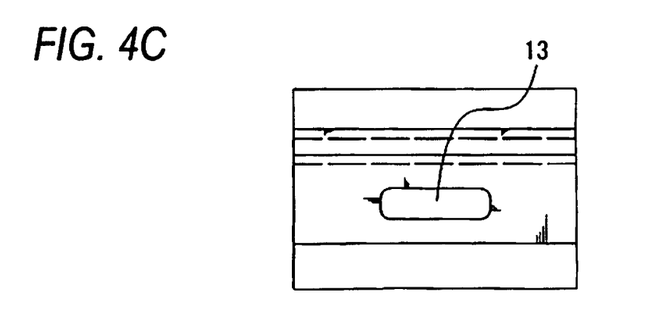

FIG. 4A is a plan view of the upper case portion 3, and FIG. 4B is a front view thereof. FIG. 4C is an enlarged view (an enlarged view of portion F of FIG. 4B) of an engaging hole 13 which will be described later.

Similarly with the lower case portion 2, the upper case portion 3 is formed into a case-like shape which has a planar portion 3a, and sidewall portions 3b, 3c, 3d, 3e that stand from the four sides of the planar portion 3a, and in which one face (the lower face in FIGS. 1A and 4B) is opened. As shown in the sectional view of FIG. 2B, in order to realize a structure in which the upper case portion 3 can be externally fitted to the lower case portion 2, the total width and length of the planar portion 3a of the upper case portion 3 are set so as to be slightly larger than the corresponding total width and length of the planar portion 2a of the lower case portion 2.

In the exemplary embodiment, an opening 2j is disposed in a part of the sidewall portion 2b, and, in correspondence with the opening 2j, an opening 3j is disposed in a part of the sidewall portion 3b, so that an opening 6 is formed in a state where the upper case portion 3 is externally fitted to the lower case portion 2 (see FIGS. 1A and 1B). A connector portion 10 of the mounting circuit board 4 can be connected with an external apparatus (not shown) such as a PC through the opening 6.

In the exemplary embodiment, in the lower case portion 2, chamfered portions 2f, 2g, 2h, 2i are disposed in boundary portions between adjacent sidewall portions, respectively. In the upper case portion 3, similarly, chamfered portions 3f, 3g, 3h, 3i are disposed in boundary portions between adjacent sidewall portions, respectively. As a result, the box-like member formed by externally fitting the upper case portion 3 to the lower case portion 2 is formed as a decahedron. According to the configuration, sharp edges in the boundary portions between adjacent sidewall portions can be eliminated. In the case portion, the electronic apparatus 1 is to be attached to a card slot of a PC, for example, the user operability can be therefore improved.

Since the electronic apparatus 1 of the exemplary embodiment is an SSD using a flash memory. Therefore, the electronic apparatus 1 is requested to have a magnetic shielding structure in order to prevent unintentional erasure and/or writing of storage information from occurring. In addition to the case of an SSD, also in the case where the electronic apparatus 1 is a communication card or the like, the electronic apparatus 1 is requested to have a magnetic shielding structure.

In regard to this point, in the exemplary embodiment, the lower case portion 2 and the upper case portion 3 are formed by using SUS304 which is a nonmagnetic metal material, thereby realizing a magnetic shielding structure.

Figure 5:
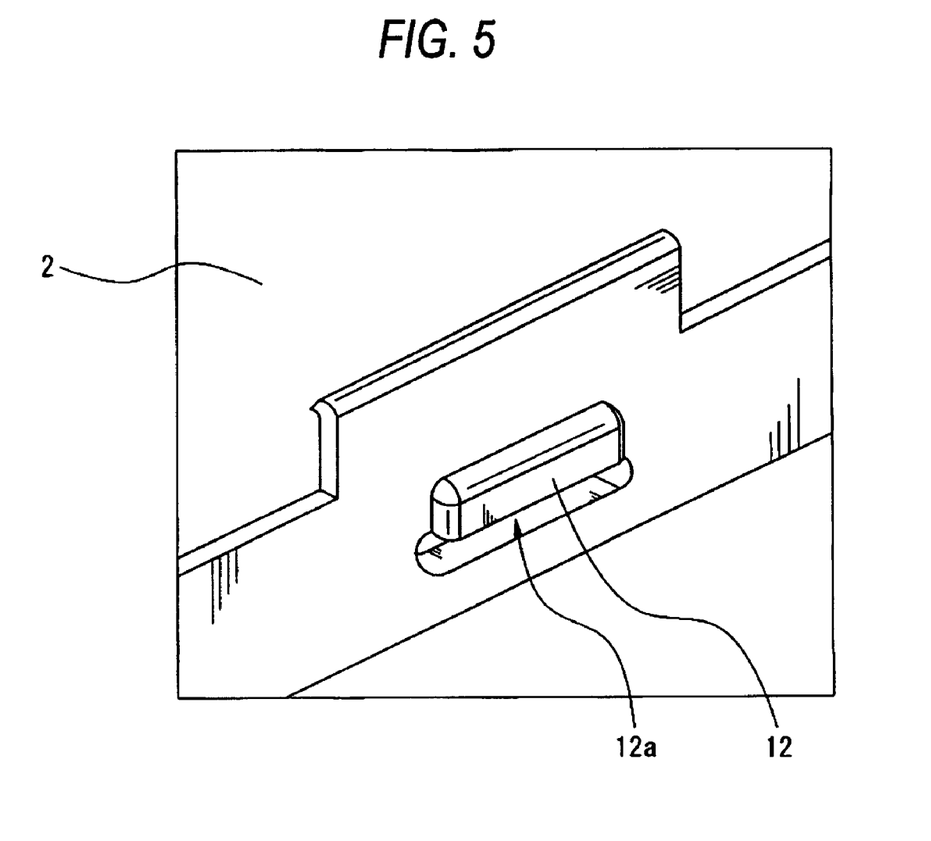
FIG. 5 is a perspective view showing an example of an engaging projection in the lower case portion of the electronic apparatus of FIGS. 1A and 1B.

As a characteristic configuration of the exemplary embodiment, as shown in FIGS. 3A, 3B, and 3C, a plurality of engaging projections 12 which are outwardly projected are respectively disposed on the sidewall portions 2b, 2c, 2d, 2e of the lower case portion 2. FIG. 5 is a perspective view of one of the engaging projections 12.

Figure 6:
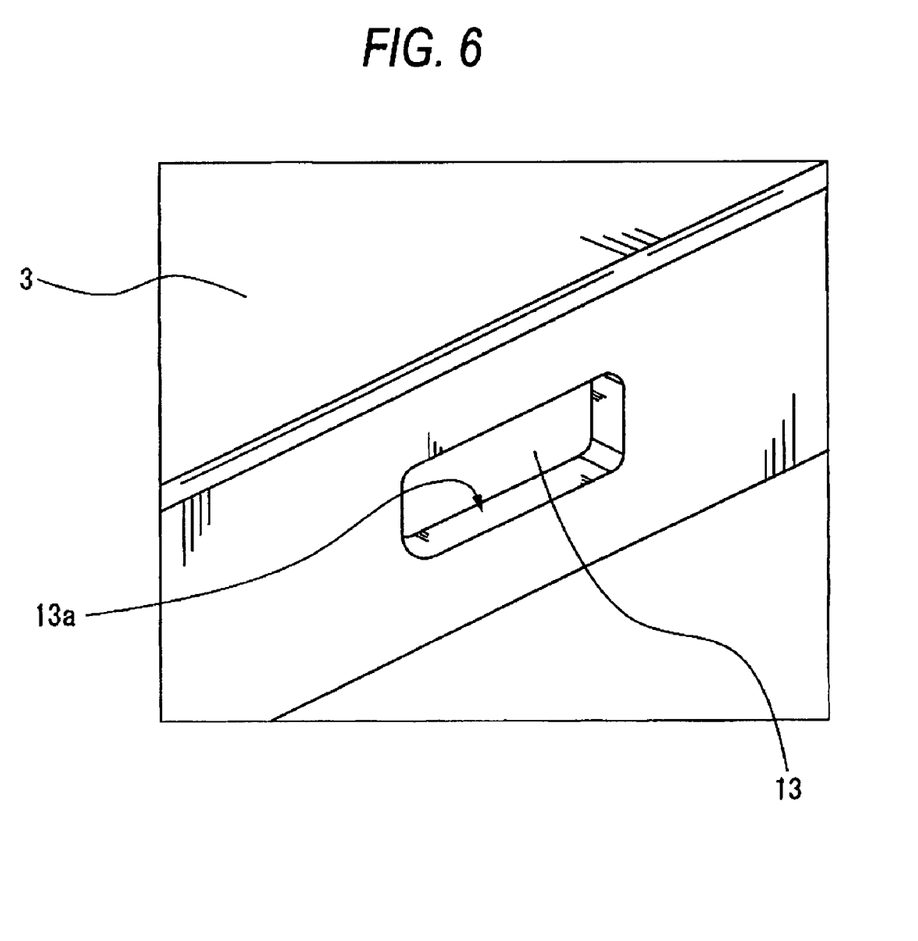
FIG. 6 is a perspective view showing an example of an engaging hole in the upper case portion of the electronic apparatus of FIGS. 1A and 1B.

In the sidewall portions 3b, 3c, 3d, 3e, by contrast, a plurality of engaging holes 13 which are passed through the sidewall portions are disposed as shown in FIGS. 4A, 4B, and 4C. The engaging holes 13 are disposed at positions which, when the upper case portion 3 is fitted to the lower case portion 2, correspond to the engaging projections 12 of the lower case portion 2, respectively. FIG. 6 is a perspective view of one of the engaging holes 13.

Figure 2B:
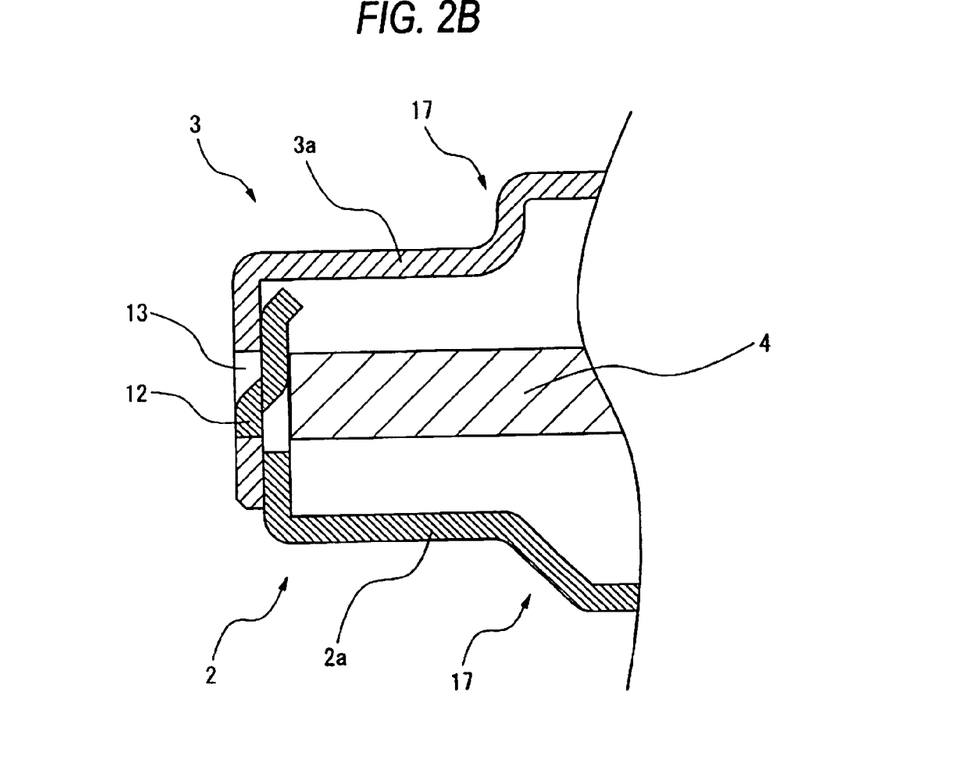

According to the configuration, when the upper case portion 3 is externally fitted to the lower case portion 2, the engaging projections 12 are engaged with the engaging holes 13, whereby the lower case portion 2 and the upper case portion 3 are fixed to each other. At the same time, the mounting circuit board 4 which is housed in the lower case portion 2 are fixed to the interior of the box-like member formed by the lower case portion 2 and the upper case portion 3 (see FIG. 2A). FIG. 2B is a sectional view (an enlarged view of portion C of FIG. 2A) in which one of engagement portions between the engaging projections 12 and the engaging holes 13 is enlargedly shown.

Tip end portions of the sidewall portions at positions where the engaging projections 12 are disposed are inwardly slightly bent, so that, when the upper case portion 3 is to be externally fitted to the lower case portion 2, the case portions are prevented from being mutually engaged, and allowed to be easily fitted to each other.

In the exemplary embodiment, as shown in FIG. 2B and FIG. 5, the engaging projections 12 are formed into a bottom spread shape in which, as more advancing from a remote position to a close position with respect to the planar portion 2a of the lower case portion 2, the projection amount is further increased.

According to the configuration, a structure where the operation of externally fitting the upper case portion 3 to the lower case portion 2 can be smoothly performed, and, when the upper case portion 3 is to be separated from the lower case portion 2, the separating operation is hardly performed unless a special tool or the like is used, so that unintentional separation is prevented from occurring.

Figure 7A:
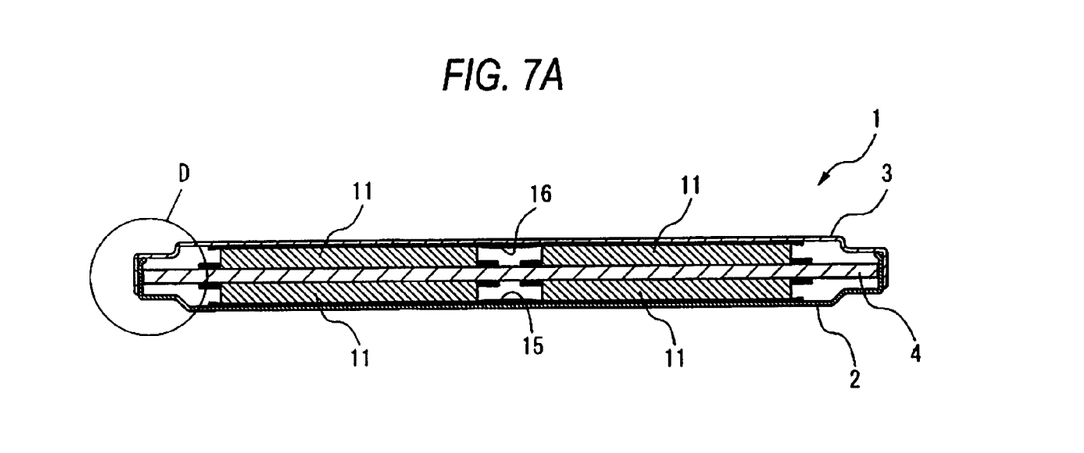
FIGS. 7A and 7B are sectional views showing an example of the electronic apparatus (in a state where the lower and upper case portions and the mounting circuit board are fixed) of FIGS. 1A and 1B.
Figure 7B:
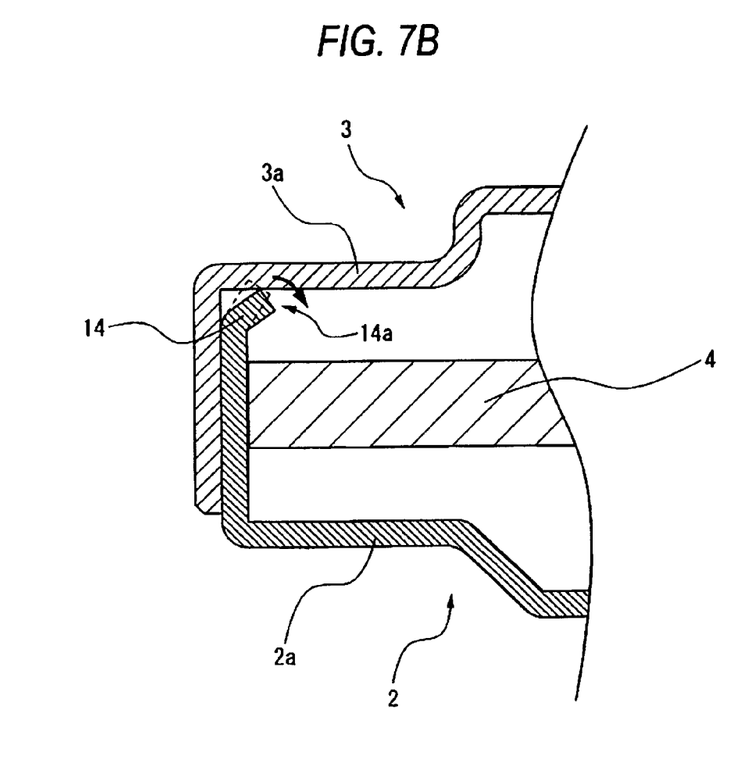

As another characteristic configuration of the exemplary embodiment, in the lower case portion 2, a part of tip end portions of the sidewall portions 2b, 2c, 2d, 2e is bent toward the inner sides of the sidewall portions 2b, 2c, 2d, 2e to be formed as urging force generating portions 14 as shown in FIGS. 3A and 3B. In the exemplary embodiment, the urging force generating portions 14 are formed into a tongue-like shape. In the tip end portions of the sidewall portions 2b, 2c, 2d, 2e, the other part which is not formed as the urging force generating portions 14 is formed so as to be lower in height from the planar portion 2a than the urging force generating portions 14. FIG. 7A is a sectional view (taken along line B-B in FIG. 1B) of the electronic apparatus 1 taken at the position where one of the urging force generating portions 14 is disposed. FIG. 7B is an enlarged view (an enlarged view of portion D of FIG. 7A) of the urging force generating portion 14.

The function of the configuration will be described with reference to FIG. 7B. In accordance with the operation of externally fitting the upper case portion 3 to the lower case portion 2, first, the tip end portions (or portions in the vicinities of the tip end portions) 14a of the urging force generating portions 14 butt against the planar portion 3a of the upper case portion 3. When the urging force generating portions 14 further press upwardly the upper case portion 3, the tip end portions (or portions in the vicinities of the tip end portions) 14a are bent toward the inner sides of the sidewall portions 2b, 2c, 2d, 2e while butting against the planar portion 3a. In this state, the engaging projections 12 are fitted into the engaging holes 13. As a result, the tip end portions 14a of the urging force generating portions 14 have a shape in which the tip end portions are further bent as compared with the original shape (the shape before they butt against the planar portion 3a of the upper case portion 3), or a state where the tip end portions are elastically deformed, and therefore an urging force of restoring to the original shape is generated. The urging force functions as a force of pressing the planar portion 3a of the upper case portion 3. Therefore, the lower case portion 2 and the upper case portion 3 are pressingly moved in mutually separating directions, and bottom spread portions 12a of the engaging projections 12 butt against and are held by end portions 13a (on the side remote from the planar portion 3a) of the engaging holes 13. Therefore, rattling of the fitting between the lower case portion 2 and the upper case portion 3 (rattling in a direction perpendicular to the planar portions 2a, 3a) is eliminated.

The disposition of the urging force generating portions 14 may cause a new problem. Specifically, the urging force generating portions 14 are bent toward the inner sides of the sidewall portions 2b, 2c, 2d, 2e of the lower case portion 2, or formed into a shape which is inwardly projected. Therefore, the problem is that it is difficult to house the mounting circuit board 4 having the total width and length which are equal to those of the planar portion 2a of the lower case portion 2, in the lower case portion 2.

As a method of solving the problem, it is contemplated to employ a structure where the mounting circuit board 4 is formed to be slightly smaller than the planar portion 2a. When such a structure is employed, however, the mounting circuit board 4 can be housed in the lower case portion 2, but rattling (rattling in a direction parallel to the planar portion 2a) is caused in the lower case portion 2. Therefore, a member for preventing the rattling from occurring must be additionally disposed, with the result that the number of parts is increased.

Figure 8:
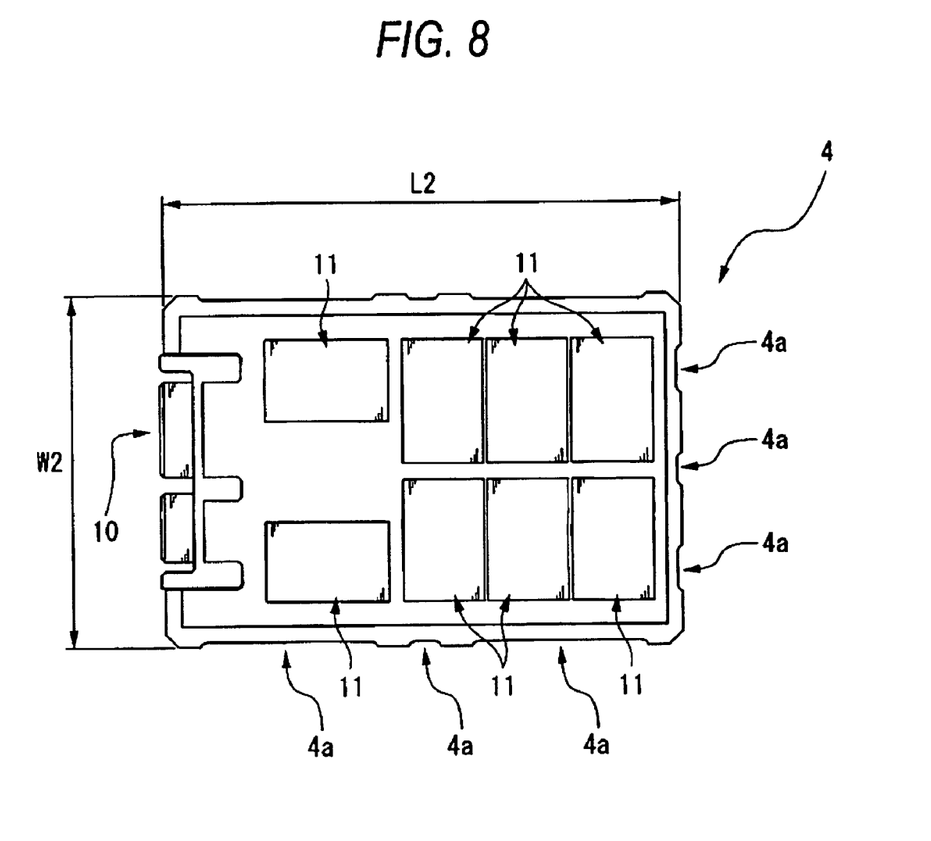
FIG. 8 is a schematic view showing an example of the mounting circuit board of the electronic apparatus of FIGS. 1A and 1B.

In order to solve the problem, in the exemplary embodiment, a structure is employed in which the total width W2 and total length L2 of the mounting circuit board 4 shown in FIG. 8 (a plan view of the mounting circuit board 4) are set to be equal to the total width W1 and total length L1 of the planar portion 2a of the lower case portion 2 shown in FIG. 3A, and rattling (rattling in a direction parallel to the planar portion 2a) is prevented from occurring without adding an additional member. Moreover, a structure in which, in the mounting circuit board 4, cutaway portions 4a are disposed at positions corresponding to the urging force generating portions 14 of the lower case portion 2 is employed. The cutaway portions 4a have a shape which is larger than the inwardly bent shape (projection shape) of the sidewall portions 2b, 2c, 2d, 2e in the urging force generating portions 14. Namely, both the width and length of the cutaway portions 4a are larger than those of projection regions of the bent portions projected onto the planar portion 2a.

According to the configuration, the mounting circuit board 4 having the total width W2 and total length L2 which are equal to the total width W1 and total length L1 of the planar portion 2a of the lower case portion 2 can be housed into the lower case portion 2 without interfering with the urging force generating portions 14 which are bent toward the inner sides of the sidewall portions 2b, 2c, 2d, 2e.

In the exemplary embodiment, also the tip end portions of the sidewall portions at the positions where the engaging projections 12 are disposed have a shape in which the portions are inwardly bent, and hence a structure where the cutaway portions 4a are similarly disposed also at positions corresponding to the bent portions is employed.

In the electronic apparatus 1 of the exemplary embodiment, elastic heat transfer sheets (thermal interface material) 15, 16 are closely disposed between the mounting circuit board 4 and the lower case portion 2, and between the mounting circuit board 4 and the upper case portion 3, respectively. According to the configuration, in the lower case portion 2 and the upper case portion 3 in the state where the case portions are fitted to each other, it is possible to prevent rattling of the mounting circuit board 4 (rattling in a direction perpendicular to the planar portions 2a, 3a) from occurring, and the heat dissipation property of the mounting circuit board 4 can be enhanced.

In the electronic apparatus 1, when a rail portion 17 is disposed on the planar portion 2a of the lower case portion 2 and the planar portion 3a of the upper case portion 3 as shown in FIGS. 1A and 2B, it is possible to form an external shape which is suitable for attachment to, for example, a card slot of a PC.

Then, an electronic apparatus 1 of a second exemplary embodiment of the invention will be described. The basic configuration of the electronic apparatus 1 of the second exemplary embodiment is identical with that of the electronic apparatus 1 of the first exemplary embodiment, and hence description will be made with focusing attention on the differences between the exemplary embodiments.

Figure 9A:
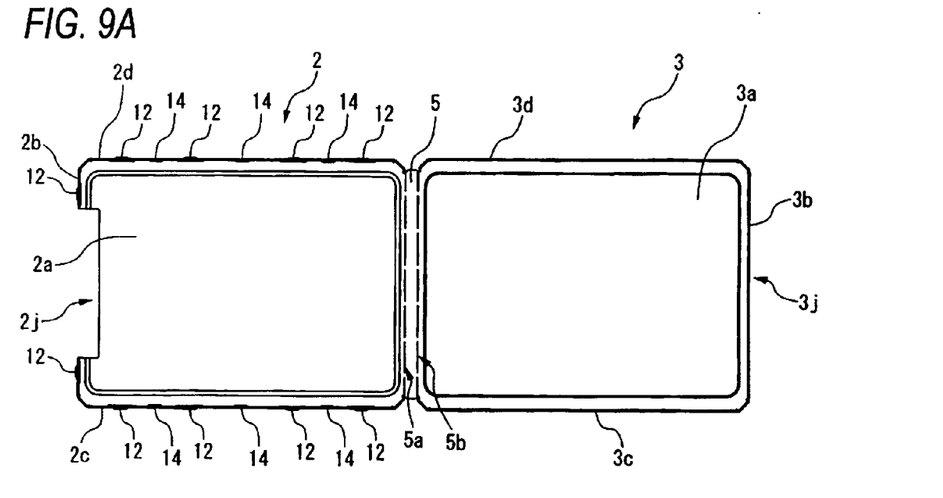
FIGS. 9A to 9C are schematic views showing an example of an electronic apparatus according to a second exemplary embodiment of the invention.
Figure 9B:
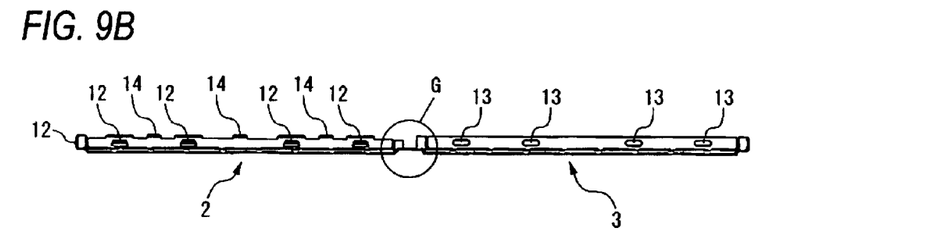

The electronic apparatus 1 of the exemplary embodiment is characterized in that the lower case portion 2 and the upper case portion 3 are integrally formed by using a single plate-like member made of a metal material. Specifically, as shown in the plan view of FIG. 9A and the front view of FIG. 9B, the planar portion 2a of the lower case portion 2 and the planar portion 3a of the upper case portion 3 are continuous to each other through a common sidewall portion 5. When a bending process is applied to the single plate-like member, other sidewall portions 2b, 2c, 2d which stand from the periphery of the planar portion 2a (three sides which are not contacted with the sidewall portion 5) are formed, and other sidewall portions 3b, 3c, 3d which stand from the periphery of the planar portion 3a (three sides which are not contacted with the sidewall portion 5) are formed. The shape of the mounting circuit board 4 which is housed in the lower case portion 2 is identical with that in the first exemplary embodiment described above (see FIG. 1A and FIG. 8), and therefore the mounting circuit board is not shown in FIGS. 9A, 9B, and 10 (described later).

Figure 9C:
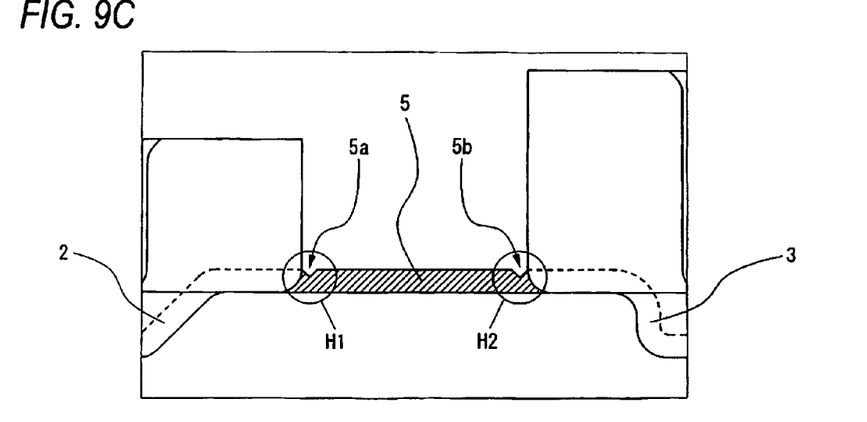
Figure 10:
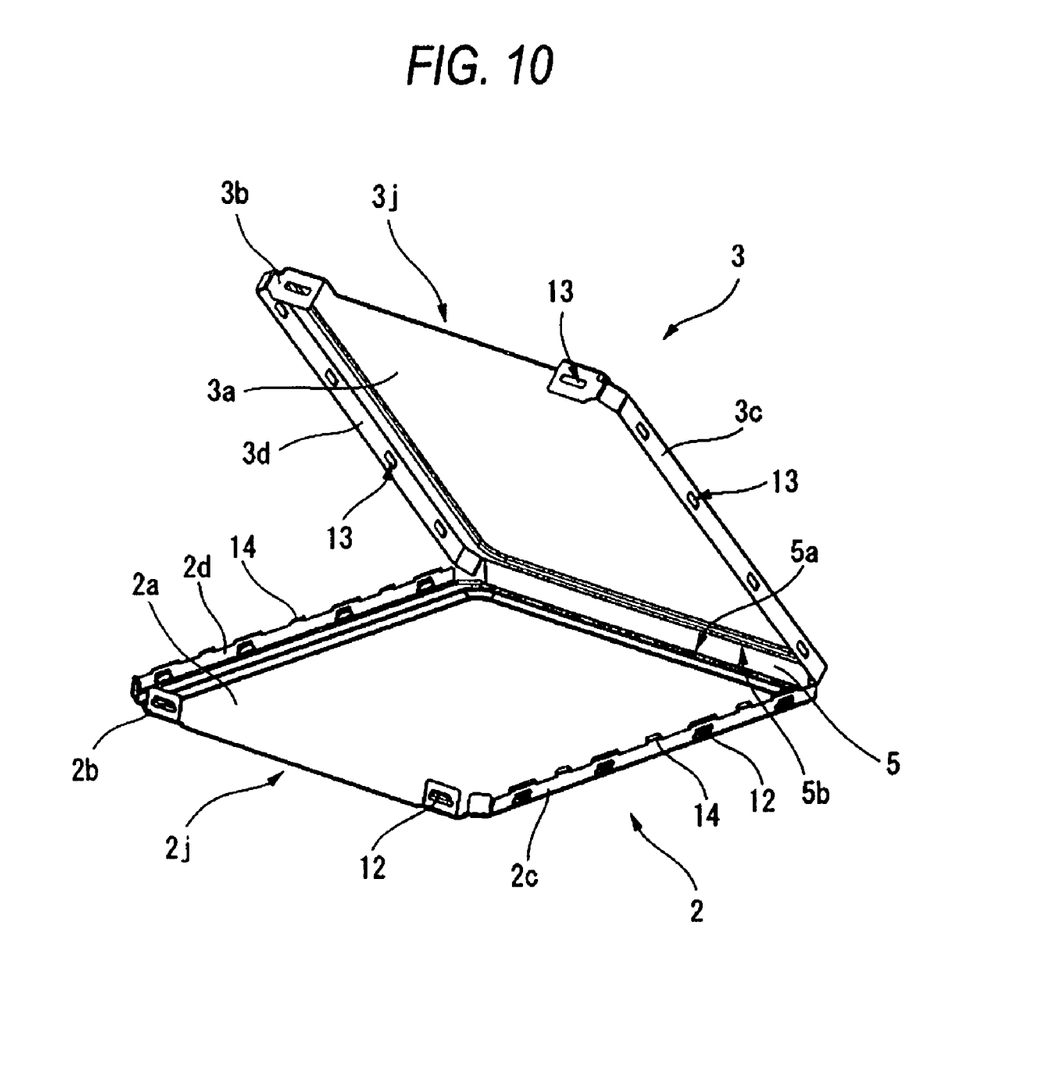
FIG. 10 is a diagram (perspective view) illustrating the structure of lower and upper case portions of the electronic apparatus of FIGS. 9A to 9C.

In the position of a boundary 5a of the sidewall portion 5 and the planar portion 2a of the lower case portion 2, a bending process is performed so that the planar portion 2a is perpendicular to the sidewall portion 5, and, in the position of a boundary 5b of the sidewall portion 5 and the planar portion 3a of the upper case portion 3, a bending process is performed so that the planar portion 3a is perpendicular to the sidewall portion 5, whereby a box-like member is formed in a similar manner as the first exemplary embodiment. In this case, when a process of forming V-notches (portions H1 and H2) is applied to the positions of the boundaries 5a, 5b as shown in the enlarged view (an enlarged view of portion G of FIG. 9B) showing the sidewall portion 5 of FIG. 9C, the bending process can be facilitated. FIG. 10 is a schematic view showing a state during the process of bending in the positions of the boundaries 5a, 5b to form the box-like member.

In the exemplary embodiment, when the mounting circuit board 4 is to be housed in the lower case portion 2, a method such as that in which, after the mounting circuit board 4 is placed on the planar portion 2a of the lower case portion 2, perpendicular bending is performed in the positions of the boundaries 5a, 5b to form a box-like member, or that in which, after perpendicular bending is performed in the position of the boundary 5a, the mounting circuit board 4 is housed in the lower case portion 2, and then perpendicular bending is finally performed in the position of the boundary 5b to form a box-like member may be employed.

In the thus configured second exemplary embodiment, because of the main reason that the case portions are integrally formed, the production steps can be more reduced, and the production cost can be further lowered as compared with the first exemplary embodiment.

As described above, according to the disclosed electronic apparatus, the mounting circuit board can be fixed only by using the lower and upper case portions. As compared with the conventional structure in which resin parts for fixation and the like are used, the part cost can be lowered by reduction of the number of parts, and the assembly work can be simplified by structure simplification. Therefore, the production cost can be lowered. In the fixation of the lower and upper case portions, welding, screwing, and riveting are not employed. Consequently, production steps can be simplified, so that the production time can be shortened and the production cost can be lowered. Furthermore, also an effect that the production efficiency is improved and the mass production of products is enabled.

The invention is not restricted to the above-described exemplary embodiments. It is a matter of course that various modifications can be made without departing the invention. Although the description of the electronic apparatus has been made by exemplifying an SSD using a NAND-type flash memory, the invention is not restricted to this apparatus. The invention can be similarly applied also to, for example, a communication card which is to be attached to a card slot of a PC.

What is claimed is:

1. A housing case for housing an electronic circuit board, comprising:
    a lower case portion which internally houses a circuit board mounting electronic components, the lower case portion including a lower case planar portion and lower case sidewall portions which stand from a peripheral edge of the lower case planar portion, the lower case planar portion and lower case sidewall portions formed by using a plate-like member made of a metal material; and
    an upper case portion which is externally fitted to said lower case portion to form a box-like member, the upper case portion including an upper case planar portion and upper case sidewall portions which stand from a peripheral edge of the upper case planar portion, the upper case planar portion and upper case sidewall portions formed by using a plate-like member made of a metal material, wherein
    said lower case sidewall portions each include a planar face having an engaging projection disposed thereon and projecting outwardly therefrom,
    said upper case sidewall portions each include a planar face having an engaging hole defined therethrough, said engaging holes disposed in said upper case sidewall portions in positions corresponding to said lower case engaging projections,
    said upper case portion is externally fitted to said lower case portion such that said upper case planar portion faces said lower case planar portion, and said lower case engaging projections are received in and engage said upper case engaging holes, whereby said lower case portion and said upper case portion are fixed to each other,
    said lower case sidewall portions have an inwardly bent first part of tip end portions formed as urging force generating portions, and a second part of said tip end portions formed so as to be lower in height from said lower case planar portion than said urging force generating portions, and
    said inwardly bent first part of tip end portions of said lower case sidewall portions are provided to directly contact, butt against and slide over said upper case planar portion to be further bent, thereby generating an urging force when said upper case portion is externally fitted to said lower case portion.

2. The housing case according to claim 1, wherein said lower case portion and said upper case portion are integrally formed together of a single plate-like member made of a metal material, into a shape in which said lower case planar portion and said upper case planar portion are continuous to each other through one common sidewall portion that is common to said lower case portion and said upper case portion, and
    said lower case portion is perpendicularly bent in a position of a boundary between said one common sidewall portion and said lower case planar portion, and said upper case portion is perpendicularly bent in a position of a boundary between said one common sidewall portion and said upper case planar portion, thereby forming said box-like member.

3. The housing case according to claim 1, wherein, in said lower case portion and said upper case portion, chamfered portions are formed in boundary portions between adjacent sidewall portions, respectively.

4. The housing case according to claim 1, wherein elastic heat transfer sheets are closely disposed between said circuit board and said lower case portion, and between said circuit board and said upper case portion, respectively.

5. The housing case according to claim 1, wherein the metal material is a nonmagnetic metal material.

6. The housing case according to claim 1, wherein said engaging projections are formed into a bottom spread shape in which a projection amount from the planar face of said lower case sidewall portions increases as a distance from said lower case planar portion decreases.

7. An electronic apparatus comprising:
said housing case according to claim 1; and
a circuit board mounting electronic components, wherein said circuit board is fixed between said upper case portion and said lower case portion.

8. The housing case according to claim 7, wherein a total width and length of said circuit board are set to be equal to a total width and length of said lower case planar portion, and cutaway portions are formed in said circuit board at positions corresponding to said urging force generating portions of said lower case portion, said cutaway portions being larger in width and length than said inwardly bent first part of tip end portions of said lower case sidewall portions.

9. The housing case according to claim 1, wherein said planar face of each of said lower case sidewall portions includes an inward face facing said lower case planar portion and an outward face facing away from said lower case planar portion, and each of said engaging projections is formed to project from the outward face of the planar face of said lower case sidewall portions in a direction away from said lower case planar portion, said planar face of each of said upper case sidewall portions includes an inward face facing said upper case planar portion and an outward face facing away from said upper case planar portion, and said engaging holes extend between the inward face and outward face of the planar face of said upper case sidewall portions, and said upper case portion is externally fitted to said lower case portion with the inward face of each planar face of said upper case sidewall portions directly abutting the outward face of an associated planar face of said lower case sidewall portions.

10. The housing case according to claim 9, wherein the inward face of each planar face of said upper case sidewall portions is flush with the outward face of the associated planar face of said lower case sidewall portions.

* * * * *